(12) United States Patent
Wen et al.

(10) Patent No.: US 6,784,110 B2
(45) Date of Patent: Aug. 31, 2004

(54) METHOD OF ETCHING SHAPED FEATURES ON A SUBSTRATE

(76) Inventors: Jianping Wen, 10327 Finch Ave., Cupertino, CA (US) 95014; Meihua Shen, 694 Perry Common, Fremont, CA (US) 94539; Hung-Kwei Hu, 19430 Via Real Dr., Saratoga, CA (US) 95070

( * ) Notice: Subject to any disclaimer, the term of this patent is extended or adjusted under 35 U.S.C. 154(b) by 36 days.

(21) Appl. No.: 10/263,019

(22) Filed: Oct. 1, 2002

(65) Prior Publication Data

US 2004/0063328 A1 Apr. 1, 2004

(51) Int. Cl.[7] ............. H01L 21/302; H01L 21/461
(52) U.S. Cl. ............. 438/706; 438/714; 438/735
(58) Field of Search ............. 438/706, 707, 438/708, 709, 711, 714, 726, 735

(56) References Cited

U.S. PATENT DOCUMENTS

| | | | |
|---|---|---|---|
| 4,764,245 A | 8/1988 | Grewal et al. | |
| 5,514,621 A | 5/1996 | Tabara et al. | |
| 5,786,276 A | 7/1998 | Brooks et al. | |
| 5,843,847 A | * 12/1998 | Pu et al. | 438/723 |
| 6,133,156 A | 10/2000 | Langley et al. | |
| 6,306,710 B1 | 10/2001 | Long et al. | |

* cited by examiner

Primary Examiner—Phuc T. Dang
(74) Attorney, Agent, or Firm—Joseph Bach; Ashok Janah

(57) ABSTRACT

In a method of etching a substrate, a substrate is provided in a process zone, the substrate having a pattern of features comprising dielectric covering semiconductor. In a first stage, an energized first etching gas is provided in the process zone, the energized first etching gas having a first selectivity of etching dielectric to semiconductor of at least about 1.8:1, wherein the dielectric is etched preferentially to the semiconductor to etch through the dielectric to at least partially expose the semiconductor. In a second stage, an energized second etching gas is provided in the process zone, the energized second etching gas having a second selectivity of etching dielectric to semiconductor of less than about 1:1.8, wherein the semiconductor is etched preferentially to the dielectric.

29 Claims, 5 Drawing Sheets

METHOD OF ETCHING SHAPED FEATURES ON A SUBSTRATE

BACKGROUND

The present invention relates to a method of etching shaped features on a substrate.

In substrate fabrication, for example, in the fabrication of integrated circuit chips on a substrate of silicon or compound semiconductor, or in the fabrication of displays, one or more layers of semiconducting, dielectric, and conducting materials are formed on the substrate and the layers are then etched to form a pattern of features on the substrate comprising, for example, gates, vias, contact holes, trenches, and/or interconnect lines. For example, one or more layers of dielectric and semiconducting material may be formed on the substrate and etched to form a pattern of features comprising raised structures, such as for example raised spacer structures between gates. The layers may be etched by providing an energized process gas to etch the substrate. The process gas may be energized to etch the substrate by RF or microwave power.

However, it is often difficult to etch features on the substrate having a desired dimension, such as a predetermined height, width or profile, or a desired shape, such as a wineglass, square, or rectangular shape. Overetching or underetching of features can cause undesirable dimensions and shapes. As an example, it can often be difficult to etch a raised feature to provide a structure having square shoulders or corners. Excessive etching of the sidewalls of the feature can erode the corners of the feature and result in rounded corners. Overetching of the sidewalls may also result in an undesirable reduction in the feature width. The rounded corners and reduction in the width of the feature can adversely affect subsequent process steps and the performance of the final integrated circuit structure.

Thus, it is desirable to etch a feature to a desired dimension or feature shape. It is further desirable to etch a feature without overetching of the sidewalls of the feature or loss of dimension of the feature.

SUMMARY

A substrate etching method comprising:
(a) providing a substrate in a process zone, the substrate having a pattern of features comprising dielectric covering semiconductor;
(b) in a first stage, providing in the process zone, an energized first etching gas having a first selectivity of etching dielectric to semiconductor of at least about 1.8:1, wherein the dielectric is etched preferentially to the semiconductor to etch through the dielectric to at least partially expose the semiconductor; and
(c) in a second stage, providing in the process zone, an energized second etching gas having a second selectivity of etching dielectric to semiconductor of less than about 1:1.8, wherein the semiconductor is etched preferentially to the dielectric.

A method of etching a substrate in a substrate processing chamber comprising an antenna and process electrodes, the method comprising:
(a) providing a substrate in the chamber, the substrate having a pattern of features, the features comprising a semiconductor mesa with a dielectric sidewall;
(b) in a first plasma stage, providing a first etching gas in the chamber and applying a first bias RF power level to the process electrodes and a first source RF power level to the antenna, thereby energizing the first etching gas to etch the semiconductor mesa and the dielectric sidewall; and
(c) in a second plasma stage, providing an energized second etching gas in the chamber and applying a second bias RF power level to the process electrodes and a second source RF power level to the antenna, thereby energizing the second etching gas to etch the semiconductor mesa and a remaining portion of the dielectric sidewall.

A method of etching a substrate in a substrate processing chamber comprising an antenna and process electrodes:
(a) providing a substrate in the chamber, the substrate having a pattern of features, the features comprising a semiconductor mesa covered by a dielectric top wall and dielectric sidewalls,
(b) in a first etching stage, providing in the chamber, an energized first etching gas comprising a halogenated non-hydrogen-containing gas and a halogenated hydrogen-containing gas in a volumetric ratio selected to etch the dielectric top wall to expose the semiconductor mesa; and
(c) in a second etching stage, providing in the chamber, an energized second etching gas comprising the halogenated non-hydrogen-containing gas and a chlorine-containing gas in a volumetric ratio selected to etch the semiconductor mesa and the dielectric sidewalls;
(d) in a third etching stage, providing a third etching gas in the chamber and applying a first bias RF power level to the process electrodes and a first source RF power level to the antenna, thereby energizing the third etching gas to further etch the semiconductor mesa and the dielectric sidewalls; and
(e) in a fourth etching stage, providing an energized fourth etching gas in the chamber and applying a second bias RF power level to the process electrodes and a second source RF power level to the antenna, thereby energizing the second etching gas to etch the semiconductor mesa and a remaining portion of the dielectric sidewalls.

A method of etching a substrate in a chamber comprising an antenna and process electrodes, the method comprising:
(a) providing the substrate in the chamber;
(b) in a first stage, providing in the chamber, an energized first etching gas comprising $CF_4$ and $CHF_3$;
(c) in a second stage, providing in the chamber, an energized second etching gas comprising $CF_4$ and $Cl_2$;
(d) in a third stage, providing in the chamber, a third etching gas comprising Ar, $CF_4$ and $O_2$, and applying a first bias RF power level to the process electrodes and a first source RF power level to the antenna;
(e) in a fourth stage, providing in the chamber, an energized fourth etching gas comprising Ar and $CF_4$, and applying a second bias RF power level to the process electrodes and a second source RF power level to the antenna; and
(f) in a fifth stage, providing in the chamber, an energized fifth etching gas comprising HBr, $Cl_2$ and $HeO_2$.

A method of etching a pattern of features on a substrate in a chamber comprising an antenna and process electrodes, the method comprising:
(a) providing a substrate in the chamber;
(b) in a first stage, providing in the chamber, an energized first etching gas comprising $CF_4$ and $CHF_3$ in a volumetric flow ratio of from about 4:1 to about 1:4;

(c) in a second stage, providing in the chamber, an energized second etching gas comprising $CF_4$ and $Cl_2$ in a volumetric flow ratio of from about 5:1 to about 2:1;

(d) in a third stage, providing in the chamber, a third etching gas comprising Ar, $CF_4$ and $O_2$ in a volumetric flow ratio of Ar to ($CF_4$ and $O_2$) of from about 1:1 to about 2:1, applying a first bias RF power level of from about 0 Watts to about 50 Watts to the process electrodes, and applying a first source RF power level of from about 800 to about 1500 Watts to the antenna to energize the third etching gas;

(e) in a fourth stage, providing in the chamber, an energized fourth etching gas comprising Ar and $CF_4$ in a volumetric flow ratio of from about 8:1 to about 20:1, applying a second bias RF power level to the process electrodes of from about 150 Watts to about 300 Watts, and applying a second source RF power level to the antenna of from about 200 Watts to about 400 Watts to energize the second etching gas; and (f) in a fifth stage, providing in the chamber, an energized fifth etching gas comprising HBr, $Cl_2$ and $HeO_2$.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

DESCRIPTION

Figure 1:
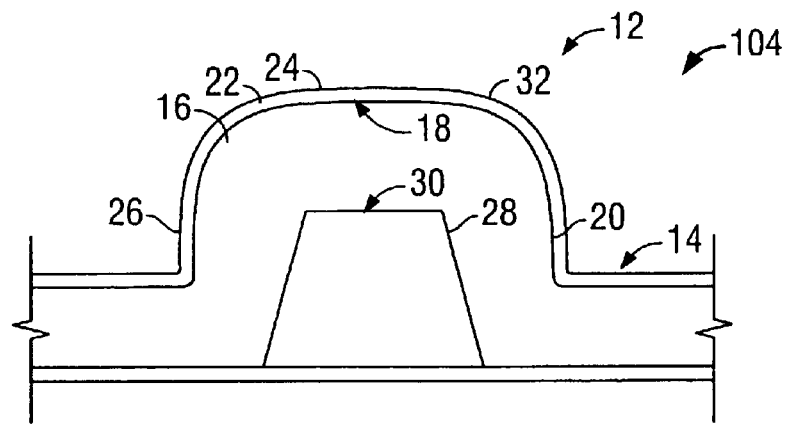
FIG. 1 is a schematic cross-sectional view of a substrate comprising a semiconductor mesa having an overlying dielectric.

An etching method is performed to etch features 12 on a substrate 10. In one version, the substrate 10 comprises a pattern of features 12, with each feature 12 comprising a semiconductor mesa 16 that is at least partially raised above a surface 14 of the substrate 10, as shown for example in FIG. 1. The semiconductor mesa 16 comprises a top surface 18, which may be generally planar, and sidewalls 20. A dielectric 22 at least partially covers and surrounds the semiconductor mesa 16. In one version, the dielectric 22 comprises a dielectric top wall 24 and dielectric sidewalls 26 which may be both made from the same dielectric material or different dielectric materials. The semiconductor mesa 16 may also at least partially cover one or more inner layers or embedded features 24, such as a dielectric embedded feature 28 comprising, for example, silicon oxide. The semiconductor mesa 16 comprises a semiconductor material, such as for example at least one of polysilicon and gallium arsenide. The dielectric 22 comprises a dielectric material, such as for example at least one of silicon oxide, silicon nitride or a low k dielectric. While the etching process is illustrated by an exemplary feature geometry and materials, it should be understood that the process can be applied to other feature geometries or materials, and the present invention should not be limited to these exemplary embodiments.

A substrate etching process is performed to etch the feature 12 to provide a desired feature shape. In the substrate etching process, the features 12 are etched to at least partially remove the overlying dielectric 22 and etch the underlying semiconductor mesa 16 to achieve a predetermined height, width, or feature shape. In the illustrative example, the underlying semiconductor mesa 16 is etched in the etching process to provide a semiconductor mesa having substantially square shoulders or corners 32. For example, the semiconductor mesa 16 may be etched such that the top surface 18 and sidewalls 20 of the semiconductor mesa 16 meet to form a corner 32 at an angle of, for example, from about 89° to about 92°, such as an angle of about 90°. The semiconductor mesa 16 may also be etched to a predetermined height substantially without an undesirable decrease in the width of the semiconductor mesa.

Figure 2:
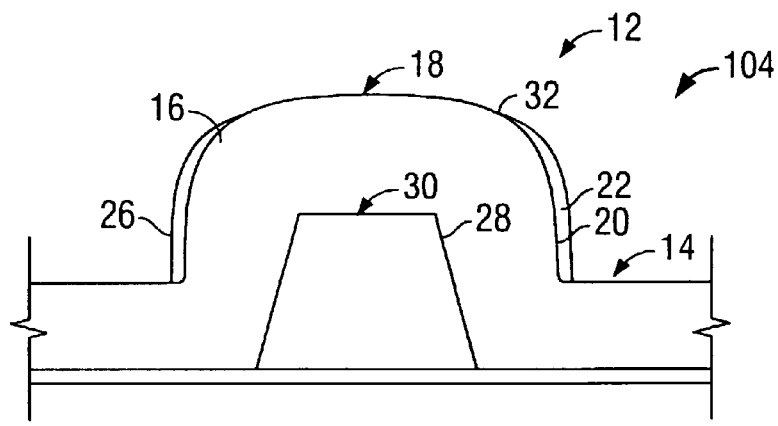
FIG. 2 is a schematic cross-sectional view of the substrate of FIG. 1 after a first etching stage has been performed to etch the overlying dielectric.

In the substrate etching process, a breakthrough etching stage is performed to etch at least a portion of the dielectric 22 overlying the semiconductor mesa 16 to "break through" the overlying dielectric 22. To perform the breakthrough etching stage, a breakthrough etching gas is energized, for example by coupling RF or microwave energy to the etching gas, and is provided in a process zone of the substrate processing chamber 106 to etch the substrate 10. The energized breakthrough etching gas comprises energized etching gas species, such as reactive dissociated and radical species, that are capable of etching the dielectric 22 on the substrate 10. The breakthrough energized etching gas etches at least a portion of the top dielectric wall 24 to expose the underlying top surface 18 of the semiconductor mesa 16, as shown in FIG. 2.

The breakthrough etching gas comprises a composition of gas capable of being energized to etch the dielectric top wall 24 on the substrate 10. For example, a suitable composition is selected to provide desired rates of etching of the dielectric and semiconductor. For example, the composition of the etching gas may be selected to etch the dielectric top wall 24 at a faster rate than the underlying top surface 18 of the semiconductor mesa 16, thereby at least partially removing the dielectric top wall 24 overlying the top surface 18 of the semiconductor mesa 16 without overetching the semiconductor mesa 16. The composition of etching gas may also be selected so that the dielectric top wall 24 is at least partially removed without overetching the dielectric sidewalls, 26, such that at least a portion of the dielectric sidewalls 26 remain after the breakthrough etching stage. For example, a suitable breakthrough etching gas composition provides a first selectivity of etching of the overlying dielectric 22 to etching of the semiconductor mesa 16 of at least about 1.8:1, and even from about 2:1 to about 10:1.

In one version, the breakthrough etching gas comprises a halogenated hydrogen-containing gas, which is a gas compound having a at least one bonded halogen and a halogen comprising one or more of fluorine, chlorine, bromine and iodine. The halogen and hydrogen species of the halogenated hydrogen-containing provide the desired etching of the overlying dielectric 22. For example, in the case where the dielectric 22 comprises an oxide, such as silicon oxide, it is believed that the hydrogen species of the halogenated hydrogen-containing gas is capable of extracting oxygen from the oxide dielectric, thereby providing a higher etching rate of the dielectric 22. The halogenated hydrogen-containing gas may also at least partially decompose in the energized gas and form a polymer on the semiconductor mesa 16, thereby inhibiting etching of the semiconductor mesa 16. Halogen species in the halogenated hydrogen-containing gas also provide good etching of the dielectric 22. Thus, desirably the halogenated hydrogen-containing gas comprises a gas compound having a ratio of bonded hydrogen to bonded halogen that is suitable to provide the desired selectivity, such as for example a ratio of hydrogen to halogen of less than about 4:1, such as a ratio of about 1:3. A suitable halogenated hydrogen-containing gas may comprise, for example, a carbon containing compound having the desired ratio of hydrogen to halogen, such as at least one of $CHF_3$, $CH_2F_2$ and $CH_3F$. In one version, the halogenated hydrogen-containing gas comprises $CHF_3$.

The breakthrough etching gas also comprises a halogenated non-hydrogen-containing gas, which is a gas compound having a bonded halogen species and that is absent any bonded hydrogen. It is believed that this gas compound provides selective etching of the semiconductor mesa 16. A suitable halogenated non-hydrogen-containing gas comprises, for example, a carbon and fluorine containing gas compound, such as at least one of $CF_4$, $C_2F_6$ and $C_4F_8$. In one version, the halogenated non-hydrogen-containing gas comprises $CF_4$. Thus, the volumetric flow ratio of the halogenated non-hydrogen containing gas to the halogenated hydrogen-containing gas may be selected to provide the desired selectivity of etching to the dielectric 22 and semiconductor mesa 16. In one version, a suitable volumetric flow ratio of halogenated non-hydrogen containing gas to the halogenated hydrogen-containing gas may be from about 5:1 to about 1:5, such as a ratio of about 1:5, and even from about 5:1 to about 1:2. For example, a volumetric flow ratio of a halogenated non-hydrogen containing gas comprising $CF_4$ to a halogenated hydrogen-containing gas comprising $CHF_3$ may be from about 4:1 to about 1:4, such as a ratio of about 1:4, and even from about 4:1 to about 1:2.

Once the overlying dielectric top wall 24 is at least partially removed from the top surface 18 of the semiconductor mesa 16, a main etching stage is performed to etch the underlying semiconductor mesa 16 to a predetermined shape. In this stage, the remaining portions of the dielectric sidewalls 26 inhibit etching of the semiconductor mesa sidewalls 20, thereby preserving the width, and reducing erosion of the corners 32, of the semiconductor mesa 16. Thus, the main energized etching gas etches the top surface 18 of the semiconductor mesa 16 and the dielectric sidewall 26 to provide a semiconductor mesa having a shape such as that shown in FIG. 3 in which the semiconductor mesa has substantially square corners 32. The gas composition is selected to provide a semiconductor mesa 16 having a desired shape by etching the top of the semiconductor mesa 16 at a faster rate than the remaining dielectric sidewalls 26, to achieve a semiconductor mesa 16 having a predetermined height. In one version, the main etching gas composition is selected to provide a second selectivity of etching of the dielectric sidewalls 26 to the semiconductor mesa 16 that is lower than the first selectivity provided during the breakthrough etching stage, thereby providing a higher semiconductor mesa etching rate in the main etching stage. The main etching gas composition may also be selected to etch the semiconductor mesa 16 and dielectric sidewalls 26 without overetching of the semiconductor mesa 16. For example, a suitable composition of the main etching gas may provide a second selectivity of less than about 1:1.8, for example from about 1:2 to about 1:4.

In one version, a suitable main etching gas comprises a composition comprising a halogenated non-hydrogen-containing gas and a chlorine-containing gas. Both the halogenated non-hydrogen-containing gas and the chlorine-containing gas comprise halogen species that are capable of etching the semiconductor mesa 16 and remaining dielectric sidewalls 26. The chlorine-containing gas comprises a gas compound having at least one bonded chlorine atom. Also, the chlorine-containing gas may substitute for the halogenated hydrogen-containing gas so that the second etching gas is substantially absent the halogenated hydrogen-containing gas. This substitution provides a higher selectivity of etching the semiconductor mesa 16, as the chlorine species of the chlorine-containing gas are capable of etching the semiconductor mesa material at a higher etch rate than the dielectric material, thereby accelerating etching of the semiconductor mesa 16. The chlorine-containing gas also forms less inhibiting polymer than the halogenated hydrogen-containing species of the breakthrough etching stage, to allow faster etching of the semiconductor mesa 16. A suitable chlorine-containing gas may comprise, for example, at least one of $Cl_2$, and HCl. In one version, the chlorine-containing gas comprises a non-carbon containing gas, such as $Cl_2$. The volumetric flow ratio of the halogenated non-hydrogen-containing gas to the chlorine-containing gas may be selected to provide the desired selectivity of etching of the dielectric sidewalls 26 to the semiconductor mesa 16. In one version, the volumetric flow ratio of the halogenated non-hydrogen-containing gas to the chlorine-containing gas is from about 10:1 to about 2:1, such as a ratio of about 2:1, and even from about 10:1 to about 5:1. For example, a suitable volumetric flow ratio of a halogenated non-hydrogen-containing gas comprising $CF_4$ to a chlorine-containing gas comprising $Cl_2$ may be from about 5:1 to about 2:1, such as a ratio of about 2:1, and even from about 5:1 to about 4:1.

After the breakthrough and main etching stages, additional etching stages may be performed to further etch the substrate 10. For example, one or more sidewall etching stages may be performed to etch or trim any remaining dielectric sidewalls 26. In one version, the remaining dielectric sidewalls 26 may be trimmed to remove the remaining sidewalls 26 before the semiconductor mesa 16 is further etched to a desired, predetermined shape. Although the sidewall etching stages are described as being performed after the breakthrough and main etching stages, the sidewall etching stages may also be performed before or between the breakthrough and main etching stages.

Figure 4:
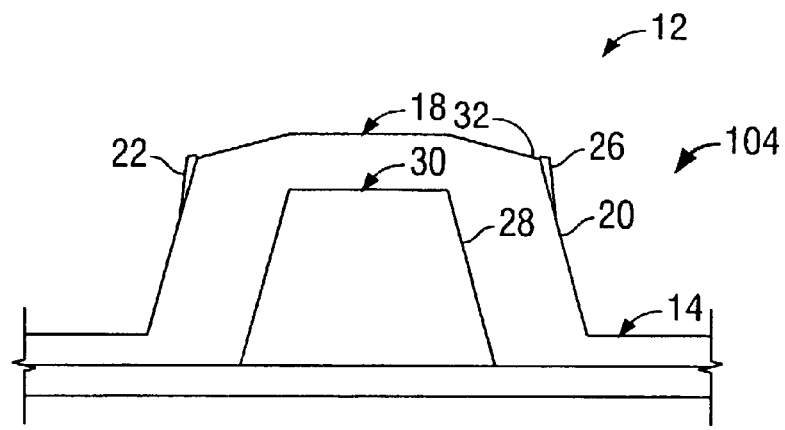
FIG. 4 is a schematic cross-sectional view of the substrate of FIG. 3 after a third etching stage has been performed to trim the remaining dielectric sidewalls in an isotropic plasma.

In one version, a first sidewall etching stage is performed after the breakthrough and main etching stages to trim the remaining dielectric sidewalls 26 by etching of the sidewalls 26. In the first sidewall etching stage, a first sidewall etching gas is provided in the process zone and a plasma is formed from the first sidewall etching gas by coupling RF energy to the gas at one or more RF power levels to etch the substrate 10. The RF power levels comprise at least one of a bias RF power level applied to one or more electrodes 138, 198 in the chamber 106, and a source RF power level applied to an antenna 186 about the chamber 106. The energized first sidewall etching gas at least partially etches the remaining dielectric sidewalls 26 to at least partially remove the dielectric sidewalls from the semiconductor mesa 16, as shown in FIG. 4.

In one version, the RF power levels are selected to provide a plasma of energized first sidewall etching gas having a more isotropic character. In an isotropic etching process, the drift velocity of the energized gas species does not have a preferred direction. In contrast, in an anisotropic etching process, the drift velocity is preferentially in a specific direction, for example, towards the surface of the substrate 10. Thus, a plasma of energized gas that provides more isotropic etching will tend to energetically etch both the sidewalls 26 as well as the top surface 18 of the features 12 on the substrate; and a plasma of energized gas that provides more anisotropic etching nature will tend to etch the top surface 18 of the features 12 more energetically than the feature sidewalls 26. Thus, by selecting the RF power levels to provide for a plasma having a more isotropic nature in the first sidewall etching stage, the width of the remaining dielectric sidewalls 26 is efficiently reduced. In one version, a plasma providing more isotropic etching is formed by applying relatively low bias RF power level of, for example, less than about 100 Watts, such as from about 0 Watts to about 50 Watts. This provides energized gas species that are not as preferentially directed towards the substrate 10, and may therefore participate in a more isotropic etching of the substrate 10. In one version, the RF bias power level may even be set at substantially zero. The RF source power may be set to provide a plasma having a more isotropic nature in the first sidewall etching stage by applying a relatively high source RF power level to the antenna about the chamber 106. The higher RF source power level provides a plasma having a more isotropic etching nature, as the source power level may induce the energized gas species to travel in directions that are parallel to the surface 14 of the substrate 10. A suitable RF source power level may be at least about 500 Watts, and even at least about 800 Watts, for example from about 800 to about 1500 Watts.

In one version, the first sidewall etching gas comprises a composition of gas that selectively etches the remaining dielectric sidewalls 26 at a higher etching rate than the semiconductor mesa 16 to remove or trim the dielectric sidewalls 26. In this version, the first sidewall etching gas comprises a reactive gas capable of etching the dielectric sidewalls 26 by reacting with the dielectric material and a non-reactive gas capable of etching the dielectric sidewalls 26 by sputtering, that is by physically bombarding and removing the dielectric material from the sidewalls 26. The reactive gas may comprise, for example, a fluorine containing gas, such as at least one of $CF_4$, $CHF_3$, $CH_3F$ and $CH_2F_2$. The non-reactive gas may comprise, for example, argon. The reactive gas may further comprise other gases that aid in the etching of the dielectric sidewalls 26, such as for example an oxygen-containing gas such as $O_2$. The volumetric flow ratio of components of the first sidewall etching gas is also selected to provide a high selectivity of etching to the dielectric, and to provide a more isotropic etching of the substrate 10. For example, the volumetric flow ratio of the non-reactive gas to the reactive gas may provide a selectivity of etching of the dielectric sidewalls 26 to etching of the semiconductor mesa 16 of at least about 2:1, for example from about 5:1 to about 10:1. A suitable volumetric flow ratio may comprise, for example, a volumetric flow ratio of the non-reactive gas to the reactive gas of less than about 3:1, for example from about 1:1 to about 2:1.

Figure 5:
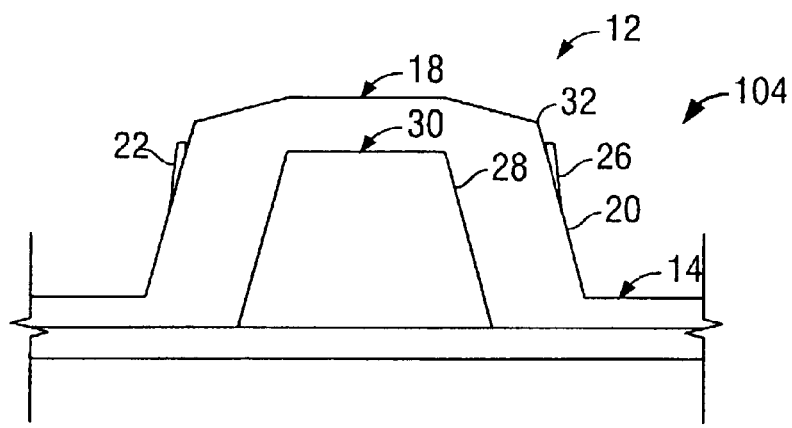
FIG. 5 is a schematic cross-sectional view of the substrate of FIG. 4 after a fourth etching stage has been performed to trim the dielectric sidewalls in an anisotropic plasma.

A second sidewall etching stage may also be performed to further trim and at least partially remove the remaining dielectric sidewalls 26. Desirably, the second sidewall etching stage is performed after the first sidewall etching stage, however, the second sidewall etching stage may also be performed before the first, and one or more of the sidewall etching stages may also be repeated. In the second sidewall etching stage, a second sidewall etching gas is introduced into the process zone and a plasma of the etching gas is formed to etch the substrate 10 by coupling RF energy to the gas at one or more RF power levels. As in the first sidewall etching stage, the RF power levels can comprise at least one of a bias RF power level applied to one or more electrodes 138, 198 in the chamber 106, and a source RF power level applied to the antenna 186 about the chamber 106. The energized sidewall etching gas further etches and removes the remaining dielectric sidewalls 26 from the sidewalls of the semiconductor mesa 16, as shown in FIG. 5.

In one version, the process conditions of the second sidewall etching stage are selected to provide a plasma of energized second sidewall etching gas having a more anisotropic etching character to etch the top of the dielectric sidewalls to reduce their height. In one version, the plasma is formed by applying a relatively high bias RF power level to the one or more electrodes 138, 198 in the chamber 106, such as a second RF bias power level that is higher than a first RF bias power level applied during the first sidewall etching stage. The higher second bias RF power level accelerates the energized gas species towards the surface 14 of the substrate 10, thereby more energetically etching the top surface of the dielectric sidewalls 26. A suitable bias RF power level is at least about 150 Watts, for example from about 150 Watts to about 300 Watts. Also, a relatively low second source RF power level is applied to the antenna 186 about the chamber 106 that is lower than a first source RF power level applied during the first sidewall etching stage. The lower source power level provides less acceleration of energized gas species in directions parallel to the surface 14 of the substrate 10, thereby reducing the component of the energized gas that etches in a direction parallel to the substrate 10, and consequently, reducing etching of the width of the dielectric sidewalls 26. A source RF power level suitable to energize the second sidewall etching gas to provide more anisotropic etching may comprise a source RF power level of less than about 500 Watts and even less than about 400 Watts, for example from about 200 Watts to about 400 Watts.

In one version, the second sidewall etching gas comprises a composition of gas that selectively etches the remaining dielectric sidewalls 26 at a higher etching rate than the semiconductor mesa 16, to remove or trim the dielectric sidewalls 26. For example, similarly to the first sidewall etching stage, a suitable composition of the second sidewall etching gas may comprise a composition of reactive gas and non-reactive gas. The reactive gas may comprise, for example, a fluorine containing gas, such as at least one of $CF_4$, $CHF_3$, $CH_3F$ and $CH_2F_2$. The non-reactive gas may comprise, for example, argon. The volumetric flow ratio of the components of the second sidewall etching gas is also selected to provide a high selectivity of etching to the dielectric, as well as a more anisotropic etching of the substrate 10. For example, the volumetric flow ratio of the non-reactive gas to the reactive gas may provide a selectivity to etching of the semiconductor mesa 16 to etching of the dielectric sidewalls of at least about 2:1, for example from about 5:1 to about 10:1. In one version, the volumetric flow ratio may be selected to provide a relatively higher amount of the non-reactive gas, to allow for more anisotropic sputtering of the substrate 10. For example, the second sidewall etching gas may comprise a second volumetric flow ratio of non-reactive to reactive gas that is higher than a first volumetric flow ratio of non-reactive to reactive gas provided during the first sidewall etching stage. A suitable second volumetric flow ratio may comprise, for example, a volumetric flow ratio of the non-reactive gas to the reactive gas of at least about 6:1, for example from about 8:1 to about 20:1.

Figure 6:
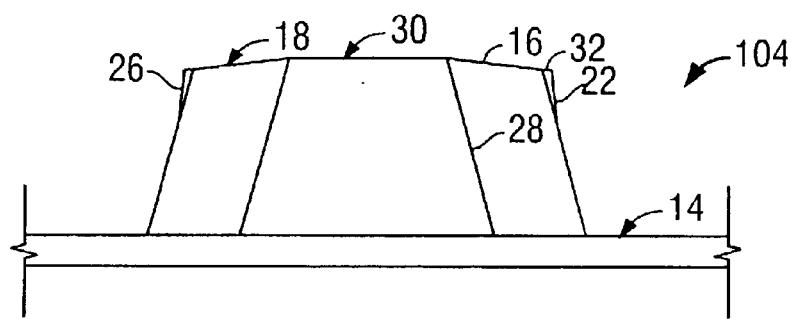
FIG. 6 is a schematic cross-sectional view of a substrate of FIG. 5 after a fifth etching stage has been performed to etch the semiconductor mesa to a desired height.

After etching of the remaining dielectric sidewalls 26 in the first and second sidewall etching stages, one or more subsequent etching steps may be performed to etch the semiconductor mesa 16 to a desired and predetermined shape. In one version, an overetching stage is performed in which an energized overetching gas is provided in the chamber 106 to etch the semiconductor mesa 16 to a desired height. The overetching gas comprises a composition of gas that provides a high selectivity of etching of the semiconductor mesa 16 to any remaining dielectric sidewalls 26. For example, the over etching gas may comprise a selectivity of etching of the semiconductor mesa 16 to etching of the dielectric 22 of at least about 20:1, for example from about 20:1 to about 100:1. A suitable overetching gas may comprise a halogen-containing gas, such as for example at least one of HBr and $Cl_2$, and an oxygen-containing etching gas, such as one or more of He—$O_2$ and $O_2$. In one version, the overetching gas comprises HBr, $Cl_2$ and He—$O_2$. The energized overetching gas etches the semiconductor mesa 16 while the remaining trimmed dielectric sidewalls 26 protect the width of the semiconductor mesa 16, such that the semiconductor mesa 16 can be etched to the desired and predetermined height without excessive etching of the semiconductor mesa sidewalls 20. The remaining dielectric sidewalls 26 may also inhibit erosion of the corners 32 of the semiconductor mesa 16, to provide substantially square corners 32. In one version, the semiconductor mesa 16 is etched to a predetermined height that is substantially equal to a height of the embedded dielectric feature 28 to expose a top surface 30 of the embedded dielectric feature 28, and to provide corners 32 that are substantially square, as shown in FIG. 6.

The endpoint of one or more stages of the etching process may be determined by a spectroscopic method. The endpoint of the etching stage may occur, for example, when a layer of the substrate 10 has been sufficiently removed, or etched through to reveal an underlying layer, or when a desired dimension, such as a desired height of a feature, has been obtained. Determination of the endpoint of the etching stage allows for etching of the substrate 10 to be halted once a stage has been completed, thereby reducing the occurrence of overetching or underetching of the substrate 10.

The endpoint of one or more of the stages may be determined by monitoring radiation emissions from plasma in the chamber 106 that emits radiation that changes in intensity and wavelength according to a change in the composition of the energized gas, such as for example, a change in composition arising from the etching through of an overlying layer to expose an underlying layer on the substrate 10. The radiation emissions may be monitored to determine, for example, the extent of etching of the substrate or other conditions in the process chamber 106. In one version, the radiation emissions are monitored by detecting the intensities of one or more wavelengths of the radiation emission. A signal is generated in relation to the detected intensities and the signal is analyzed, for example, by the controller 300. The signal trace may be analyzed to determine the presence of a characteristic feature comprising a change in an intensity of one or more wavelengths of the radiation, such as an increase or decrease in the intensity, that is indicative of the etching stage endpoint. The increase or decrease in the signal intensity may be indicative of, for example, etching through a layer to expose an underlying layer.

For example, the endpoint of the breakthrough etching stage may be determined by monitoring the intensities of wavelengths of radiation emissions from the plasma in the chamber. The detected radiation intensities are analyzed to determine a change in the intensities that is indicative of having etched through the overlying dielectric 22 to expose at least a portion of the underlying top surface 18 of the semiconductor mesa 16. For example, radiation emissions having wavelengths of from about 400 nm to about 500 nm may be monitored to determine the endpoint of the breakthrough etching stage. In another version, the endpoint of the over etching stage is determined by monitoring the radiation emission intensities. In this version, the detected radiation intensities are analyzed to determine a change in intensity that occurs once the semiconductor mesa 16 has been etched to a height that exposes the embedded dielectric feature 28. For example, radiation emissions having wavelengths of from about 200 nm to about 500 nm may be monitored to determine the endpoint of the over etching stage.

The endpoint of one or more of the etching stages can also be determined by monitoring radiation that is reflected from the substrate during the etching process. The radiation reflected from the substrate 10 may comprise radiation emissions from an energized etching gas in the chamber 106 that are reflected from the surface of the substrate 10, or may comprise radiation from a separate radiation source 212 that is directed onto the substrate in an incident beam of radiation 214 and reflected from the substrate 10 to form a reflected radiation beam 216. The intensities of one or more wavelengths of the reflected radiation are detected, and a signal is generated in relation to the intensities that may be analyzed, for example, by the controller 300. For example, a signal trace of the intensities may be generated from the signal and analyzed to determine an etching endpoint. In one version, the signal trace of the reflected radiation comprises interference minima and maxima that are related to the progress of an etching stage, and that may be counted to determine an endpoint of the etching stage. For example, the number of minima and maxima may be related to a depth of etching of a layer or feature on the substrate 10. The signal trace may also be analyzed to determine a characteristic feature of the signal trace that is indicative of the etching endpoint. In one version, polarized reflected radiation is monitored to determine the etching stage endpoint, for example as described in U.S. patent application Ser. No. 09/695,577, to Sui et al, and assigned to Applied Materials, filed on Oct. 23, 200 and U.S. patent application Ser. No. 09/803,080, to Sui et al, and assigned to Applied Materials, filed on Mar. 8, 2001, both of which are herein incorporated by reference in their entireties. The polarized reflected radiation may be generated by placing radiation polarizers 222 in the path of one or more of the incident or reflected radiation beam 214, 216. Detection of the polarized radiation allows for an improved signal to noise ratio over other interferometric methods. In one version, polarized radiation reflected from the surface 14 of the substrate 10 is monitored to determine the endpoint of the main etching stage. In this version, the minima and maxima of the signal trace resulting from the detection of the polarized reflected radiation are analyzed to determine a when a desired depth of etching of the semiconductor mesa 16 has been achieved.

Figure 7:
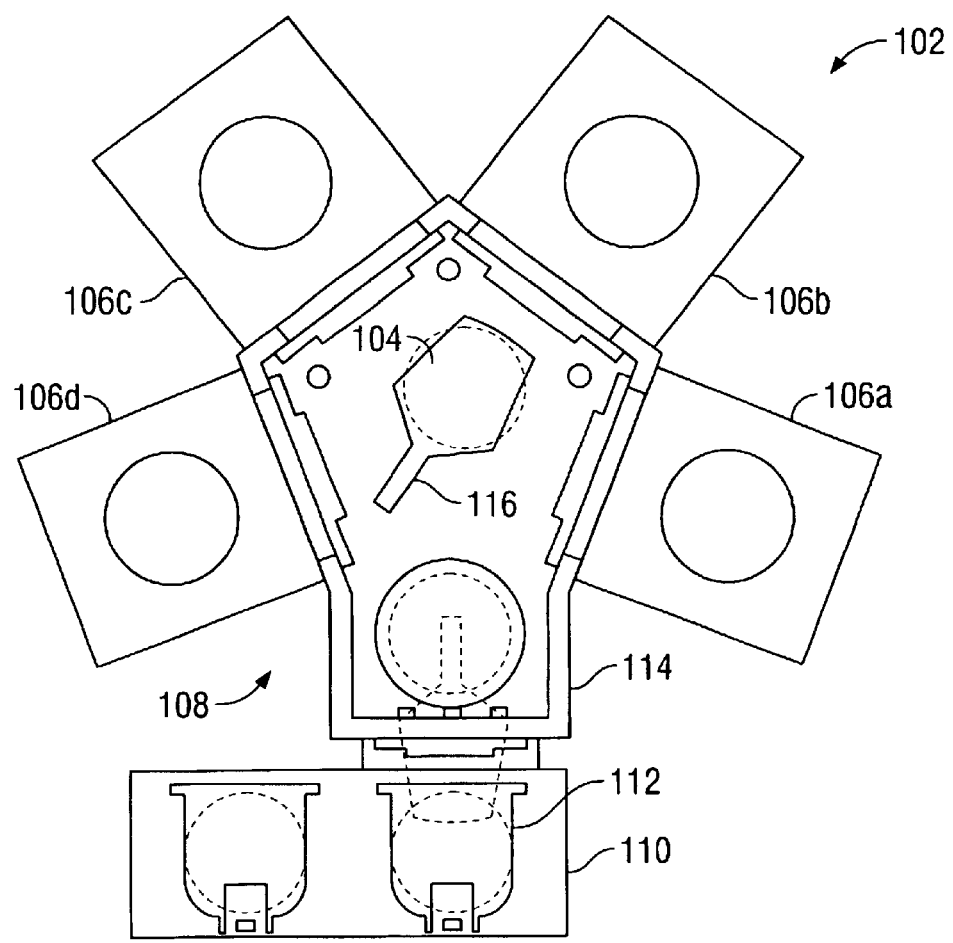
FIG. 7 is a schematic top view of a multi-chamber processing apparatus according to an embodiment of the present invention.

An embodiment of an apparatus 102 suitable for processing substrates 104 comprises one or more process chambers 106a–d, as shown in FIG. 7. The chambers 106a–d are mounted on a platform, such as a Precision 5000™ platform from Applied Materials, Inc., of Santa Clara, Calif., that provides electrical, plumbing, and other support functions. The platform 108 typically supports a load lock 110 to receive a cassette 112 of substrates 104 to be processed and a substrate transfer chamber 114 containing a robot 116 to transfer substrates from the cassette 112 to the different chambers 106a–d for processing and return them after processing. The different chambers 106a–d may include, for example, an etching chamber for etching substrates, a resist stripping chamber for removing residue remaining on substrates, a deposition chamber for depositing materials on substrates, annealing chambers, and oxidation or nitridation chambers. The chambers 106a–d are interconnected in a vacuum environment so that the process may proceed uninterrupted within the apparatus 102, thereby reducing contamination of substrates 104 that may otherwise occur when transferring substrates between separate chambers for different process stages. The particular embodiment of the apparatus 102 shown herein is suitable for processing substrates 104 such as semiconductor wafers, and may be adapted by those of ordinary skill to process other substrates 104, such as flat panel displays, polymer panels, or other electrical circuit receiving structures; thus, the apparatus 102 should not be used to limit the scope of the invention or its equivalents to the exemplary embodiments provided herein.

Figure 8:
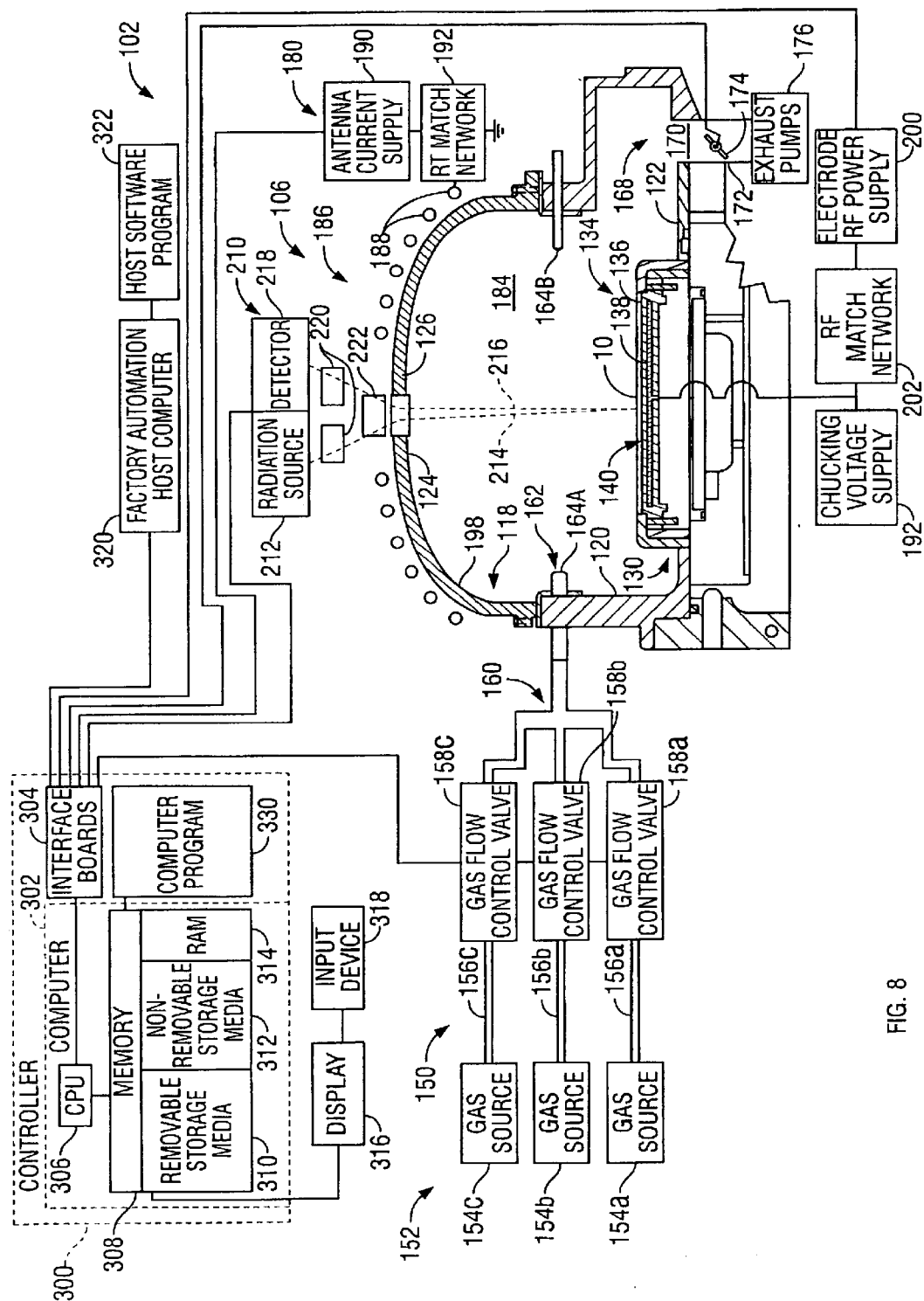
FIG. 8 is a partial sectional schematic side view of a version of a chamber according an embodiment of the present invention.

An exemplary version of a chamber 106 capable of etching silicon-containing material on a substrate 10 is schematically illustrated in FIG. 8. The chamber 106 is representative of a decoupled plasma source (DPS) chamber commercially available from Applied Materials Inc., Santa Clara, Calif. A typical chamber 106 comprises enclosure walls 118 that include sidewalls 120, a bottom wall 122, and a ceiling 124. The ceiling 124 may comprise a substantially arcuate shape, or in other versions, a dome, substantially flat, or multi-radius shape. The chamber 106 can have a volume of at least about 5,000 cm$^3$, and more typically, a volume of from about 10,000 to about 50,000 cm$^3$ when processing 200 to 300 mm silicon wafer substrates, or equivalent volumes for smaller or larger substrates 104. The walls 118 are typically fabricated from a metal, such as aluminum, or other ceramic materials. The ceiling 124 and/or sidewalls 120 can also have a radiation permeable window 126 that allows radiation to pass through for monitoring processes being conducted in the chamber 106.

The chamber 106 further comprises a substrate support 130 to support a substrate 10 in the chamber. The substrate support 130 typically comprises an electrostatic chuck 134 comprising a dielectric body 136 that at least partially covers an electrode 138 and which may include a substrate receiving surface 140. The electrode 138 may also serve as a process electrode. The electrode 138 may be capable of generating an electrostatic charge for electrostatically holding the substrate 10 to the electrostatic chuck 134. For example, the electrode 138 be made from a metal such as tungsten, tantalum, or molybdenum. A chucking voltage supply 142 applies a DC chucking voltage to the electrode 138.

In operation, process gas is introduced into the chamber 106 through a gas delivery system 150 that includes a process gas supply 152 comprising gas sources 154a–c that each feed a conduit 156a–c having a gas flow control valve 158a–c, such as a mass flow controller, to pass a set flow rate of the gas therethrough. The conduits 156a–c feed the gases to a mixing manifold 160 in which the gases are mixed to form a desired process gas composition. The mixing manifold 160 feeds a gas distributor 162 having gas outlets 164a,b in the chamber 106. The gas outlets 164a,b may pass through the chamber sidewalls 120 to terminate about a periphery of the substrate support 130 (as shown) or may pass through the ceiling 106 to terminate above the substrate 10 (not shown). Spent process gas and byproducts are exhausted from the chamber 106 through an exhaust system 168 which includes one or more exhaust ports 170 that receive spent process gas and pass the spent gas to an exhaust conduit 172 in which there is a throttle valve 174 to control the pressure of the gas in the chamber 106. The exhaust conduit 172 feeds one or more exhaust pumps 176. The exhaust system 168 may also contain an effluent treatment system (not shown) for abating undesirable gases that are exhausted.

The process gas is energized to process the substrate 10 by a gas energizer 180 that couples energy to the process gas in a process zone 184 of the chamber 106 (as shown) or in a remote zone upstream from the chamber 106 (not shown). In one version, the gas energizer 180 comprises an antenna 186 comprising one or more inductor coils 188 which may have a circular symmetry about the center of the chamber 106. Typically, the antenna 186 comprises solenoids having from about 1 to about 20 turns with a central axis coincident with the longitudinal vertical axis that extends through the process chamber 106. A suitable arrangement of solenoids is selected to provide a strong inductive flux linkage and coupling to the process gas. When the antenna 186 is positioned near the ceiling 124 of the chamber 106, the adjacent portion of the ceiling 124 may be made from a dielectric material, such as silicon dioxide, which is transparent to RF or electromagnetic fields. The antenna 186 is powered by an antenna current supply 190 and the applied power is tuned by an RF match network 192. The antenna current supply 190 provides, for example, RF power to the antenna 186 at a frequency of typically about 50 KHz to about 60 MHz, and more typically about 13.56 MHz; and at a power level of from about 100 to about 5000 Watts.

When an antenna is used in the chamber 106, the walls 118 include a ceiling 124 made from a induction field permeable material, such as aluminum oxide or silicon dioxide, to allow the inductive energy from the antenna 186 to permeate through the walls 118 or ceiling 124. A suitable semiconductor material is doped silicon. For doped silicon semiconducting ceilings, the temperature of the ceiling 124 is preferably held in a range at which the material provides semiconducting properties and in which the carrier electron concentration is fairly constant with respect to temperature. For doped silicon, the temperature range may be from about 100 K (below which silicon begins to have dielectric properties) to about 600 K (above which silicon begins to have metallic conductor properties).

In one version, the gas energizer 160 is also a pair of electrodes 138, 198, that may be capacitively coupled to provide a plasma initiating energy to the process gas or to impart a kinetic energy to energized gas species. Typically, one electrode 138 is in the support substrate 10 below the substrate 10 and the other electrode 198 is a wall, for example, the sidewall 120 or ceiling 124, of the chamber 106. For example, the electrode 198 may be a ceiling 118 made of a semiconductor that is sufficiently electrically conductive to be biased or grounded to form an electric field in the chamber 106 while still providing low impedance to an RF induction field transmitted by the antenna 186 above the ceiling 124. A suitable semiconductor comprises silicon doped to have an electrical resistivity of, for example, less than about 500 Ω-cm at room temperature. Generally, the electrodes 138, 198 may be electrically biased relative to one another by an a biasing voltage supply 200 that provides an RF bias voltage to the electrodes 138, 198 to capacitively couple the electrodes 138, 198 to one another. The applied RF voltage is tuned by an RF match network 202. The RF bias voltage may have frequencies of about 50 kHz to about 60 MHz, or about 13.56 MHz, and the power level of the RF bias current is typically from about 50 to about 3000 watts.

The apparatus 102 may further comprise a process monitor 210 adapted to monitor a process being conducted in the chamber 106. The process monitor 210 may be an interferometer or a plasma emission analyzer. The plasma emission analyzer typically receives a radiation emission emitted from a plasma in the process zone 184 and analyzes the intensity of particular wavelengths of the emission spectra to determine an endpoint of a process. The interferometer detects radiation, such as light, that is interferometrically reflected from the surface layers on the substrate 10 to determine an end of processing of a layer. The reflected radiation may originate from a radiation source or from the plasma in the chamber. In one version, the process monitor 210 comprises a radiation source 212 to direct a radiation beam 214 toward the substrate 10. The incident radiation beam 214 is reflected from the substrate 10 to form a reflected beam 216, and a radiation detector 218 receives the reflected beam 216 to determine a property of the process or the substrate 10. The radiation may be light, such as infrared, visible or ultraviolet light.

In one version, the process monitor 212 comprises an interferometer comprising a radiation source 212 to provide a light beam 214 having an intensity sufficiently high to generate a light beam 216 that is reflected from the substrate 10 with a measurable intensity. The radiation source 212 may comprise a monochromatic light source that provides a selected wavelength of light, for example, a He—Ne or ND-YAG laser; or a polychromatic light source capable of generating light having a plurality of wavelengths, such as a xenon or deuterium lamp or light emitted by a plasma emission in the chamber 106. A suitable radiation source 212 can generate light comprising wavelengths of from about 100 nm to about 1000 nm. The detector 218 detects the reflected radiation beam 216. The light may be filtered, before or after reflection from the substrate 10, using suitable filters 220 to allow monitoring discrete wavelengths of light. In one version, the interferometer may further comprise a radiation polarizer 222 positioned in the path of the incident or reflected radiation beams 214,216 polarize the radiation.

The chamber 106 may be operated by a controller 300 comprising a computer 302 that sends instructions via a hardware interface 304 to operate the chamber components, including the substrate support 130 to raise and lower the substrate support 130, the gas flow control valves 158a–c, the gas energizer 180, and the throttle valve 174. The process conditions and parameters measured by the different detectors in the chamber 106, or sent as feedback signals by control devices such as the gas flow control valves 158a–c, pressure monitor (not shown), throttle valve 174, and other such devices, are transmitted as electrical signals to the controller 300. Although, the controller 300 is illustrated by way of an exemplary single controller device to simplify the description of present invention, it should be understood that the controller 300 may be a plurality of controller devices that may be connected to one another or a plurality of controller devices that may be connected to different components of the chamber 106—thus, the present invention should not be limited to the illustrative and exemplary embodiments described herein.

The controller 300 comprises electronic hardware including electrical circuitry comprising integrated circuits that is suitable for operating the chamber 106 and its peripheral components. Generally, the controller 300 is adapted to accept data input, run algorithms, produce useful output signals, detect data signals from the radiation detector 218 and other chamber components, and to monitor or control the process conditions in the chamber 106. For example, the controller 300 may comprise a computer 302 comprising (i) a central processing unit (CPU) 306, such as for example a conventional microprocessor from INTEL corporation, that is coupled to a memory 308 that includes a removable storage medium 310, such as for example a CD or floppy drive, a non-removable storage medium 312, such as for example a hard drive or ROM, and RAM 314; (ii) application specific integrated circuits (ASICs) that are designed and preprogrammed for particular tasks, such as retrieval of data and other information from the chamber 106, or operation of particular chamber components; and (iii) interface boards 304 that are used in specific signal processing tasks, comprising, for example, analog and digital input and output boards, communication interface boards, and motor controller boards. The controller interface boards 304, may for example, process a signal from a process monitor 210 and provide a data signal to the CPU 306. The computer 302 also has support circuitry that include for example, co-processors, clock circuits, cache, power supplies and other well known components that are in communication with the CPU 306. The RAM 314 can be used to store the software implementation of the present invention during process implementation. The instruction sets of code of the present invention are typically stored in storage mediums 310, 312 and are recalled for temporary storage in RAM 314 when being executed by the CPU 306. The user interface between an operator and the controller 300 can be, for example, via a display 316 and a data input device 318, such as a keyboard or light pen. To select a particular screen or function, the operator enters the selection using the data input device 318 and can reviews the selection on the display 316.

The data signals received and evaluated by the controller 300 may be sent to a factory automation host computer 320. The factory automation host computer 320 may comprise a host software program 322 that evaluates data from several systems, platforms or chambers 106, and for batches of substrates 104 or over an extended period of time, to identify statistical process control parameters of (i) the processes conducted on the substrates, (ii) a property that may vary in a statistical relationship across a single substrate, or (iii) a property that may vary in a statistical relationship across a batch of substrates. The host software program 322 may also use the data for ongoing in-situ process evaluations or for the control of other process parameters. A suitable host software program comprises a WORKSTREAM™ software program available from aforementioned Applied Materials. The factory automation host computer 320 may be further adapted to provide instruction signals to (i) remove particular substrates 104 from the etching sequence, for example, if a substrate property is inadequate or does not fall within a statistically determined range of values, or if a process parameter deviates from an acceptable range; (ii) end processing in a particular chamber 106, or (iii) adjust process conditions upon a determination of an unsuitable property of the substrate 304 or process parameter. The factory automation host computer 320 may also provide the instruction signal at the beginning or end of etching of the substrate 10 in response to evaluation of the data by the host software program 322.

In one version, the controller 300 comprises a computer program 330 that is readable by the computer 302 and may be stored in the memory 308, for example on the non-removable storage medium 312 or on the removable storage medium 310. The computer program 330 generally comprises process control software comprising program code to operate the chamber 106 and its components, process monitoring software to monitor the processes being performed in the chamber 106, safety systems software, and other control software. The computer program 330 may be written in any conventional programming language, such as for example, assembly language, C++, Pascal, or Fortran. Suitable program code is entered into a single file, or multiple files, using a conventional text editor and stored or embodied in computer-usable medium of the memory 308. If the entered code text is in a high level language, the code is compiled, and the resultant compiler code is then linked with an object code of pre-compiled library routines. To execute the linked, compiled object code, the user invokes the object code, causing the CPU 306 to read and execute the code to perform the tasks identified in the program.

Figure 9:
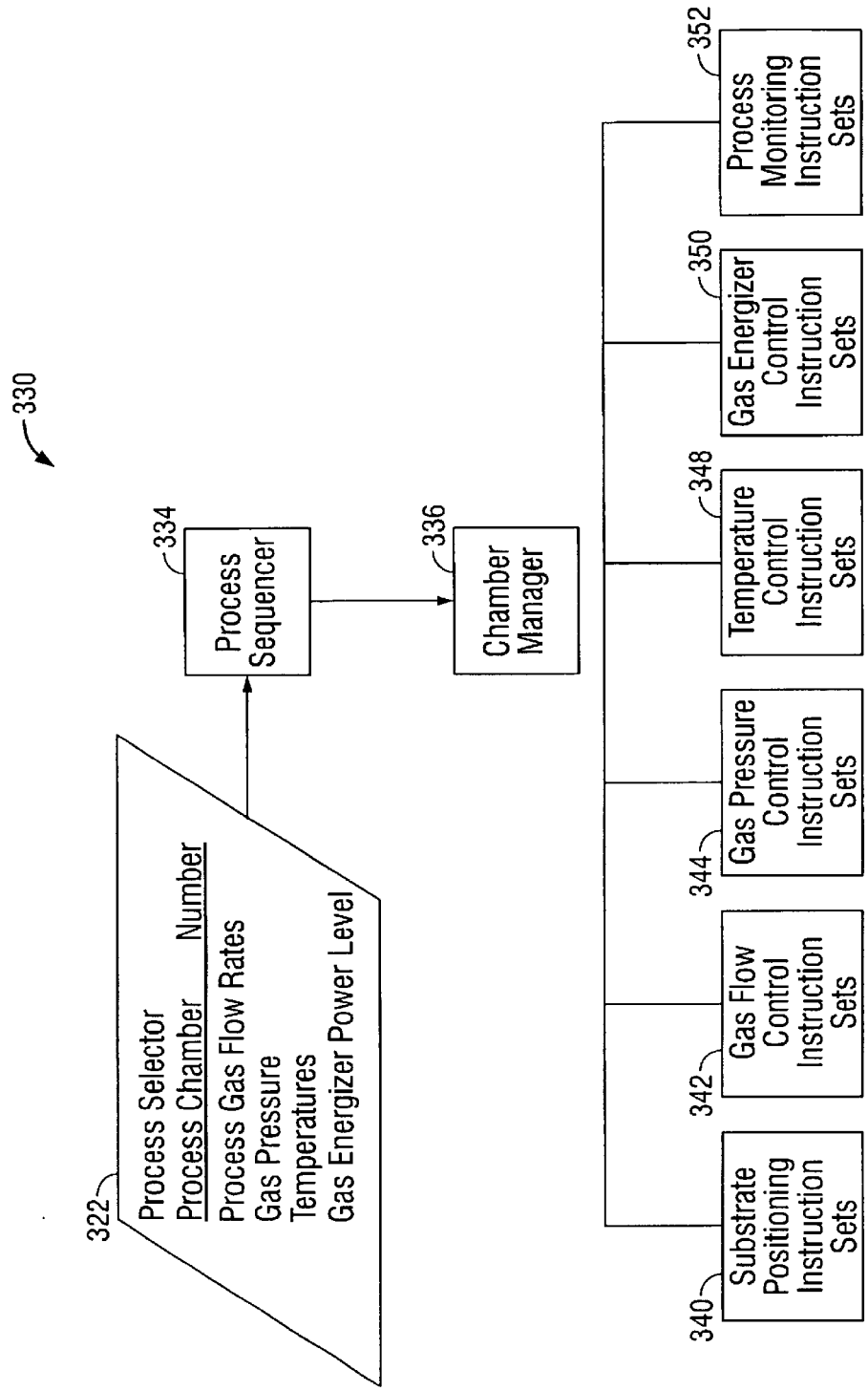
FIG. 9 is an illustrative block diagram of a controller comprising a computer readable program.

An illustrative block diagram of a hierarchical control structure of a specific embodiment of a computer program 330 according to the present invention is shown in FIG. 9. Using the data input device 318, for example, a user enters a process set and chamber number into the computer program 330 in response to menus or screens on the display 316 that are generated by a process selector 332. The computer program 330 includes instruction sets to control the substrate position, gas flow, gas pressure, temperature, RF power levels, and other parameters of a particular process, as well as instructions sets to monitor the chamber process. The process sets are predetermined groups of process parameters necessary to carry out specified processes. The process parameters are process conditions, including without limitations, gas composition, gas flow rates, temperature, pressure, and gas energizer settings such as RF or microwave power levels. The chamber number reflects the identity of a particular chamber when there are a set of interconnected chambers on a platform.

A process sequencer 334 comprises instruction sets to accept a chamber number and set of process parameters from the computer program 330 or the process selector 332 and to control its operation. The process sequencer 334 initiates execution of the process set by passing the particular process parameters to a chamber manager 336 that controls multiple tasks in a chamber 106. The chamber manager 336 may include instruction sets, such as for example, substrate positioning instruction sets 340, gas flow control instruction sets 342, gas pressure control instruction set 344, temperature control instruction sets 348, gas energizer control instruction sets 350, and process monitoring instruction sets 352. The substrate positioning instruction set 340 comprises code for controlling chamber components that are used to load a substrate 10 onto the substrate support 130, and optionally, to lift a substrate 10 to a desired height in the chamber 106. The gas pressure control instruction sets 344 comprise program code for controlling the pressure in the chamber 106 by regulating open/close position of the throttle valve 174. The temperature control instruction sets 348 may comprise, for example, code for controlling the temperature of the substrate 10 during etching or code for controlling the temperature of walls of the chamber 106, such as the temperature of the ceiling.

The gas flow control instruction sets 342 comprises code for controlling the flow rates of different constituents of the process gas. For example, the gas flow control instruction sets 342 may regulate the opening size of the gas flow control valves 158a–c to obtain the desired gas flow rates from the gas outlets 164a,b into the chamber 106. For example, the gas flow control instruction sets 342 can comprise code to set a volumetric flow ratio of halogenated non-hydrogen-containing gas to halogenated hydrogen-containing gas in the breakthrough etching stage that is selected to etch the top wall 24 of the dielectric 22 to at least partially expose an underlying top surface 18 of the semiconductor mesa 16. The instruction sets 342 can also comprise code to set a volumetric flow ratio of halogenated non-hydrogen-containing gas to chlorine-containing gas that is selected to etch the top surface 18 of the semiconductor mesa 16. The instruction sets 342 can further comprise code to set first and second volumetric flow ratios of non-reactive to reactive gas during the first and second dielectric sidewall etching stages The gas energizer control instruction sets 350 comprise code for setting, for example, the RF power level applied to the electrodes 138, 198 or to the antenna 186. In one version, the gas energizer control instruction sets 350 comprise code for setting a first bias RF power level applied to electrodes 138, 198 to energize the gas in the first dielectric sidewall etching stage, and setting a second bias RF power level during the second dielectric sidewall etching stage. In another version, the gas energizer control instruction sets 350 comprise code for setting a first source RF power level applied to the antenna 186 to energize the gas during the first dielectric sidewall etching stage, and setting a second source RF power level during the second dielectric sidewall etching stage.

The process monitoring instruction sets 352 may comprise program code to monitor a process in the chamber 106. For example, the process monitoring instruction sets 153 may comprise program code to analyze a signal generated in relation to the detected intensities of wavelengths of radiation reflected from the substrate 10 or energized gas radiation emissions. The process monitoring instruction sets 153 comprises program code to analyze a signal trace of the intensities of the wavelengths by counting the number of minima and maxima detected in the signal to determine the interference fringes in the measured reflected radiation beam 216 and from that, the thickness of a layer on the substrate 10. The process monitoring instruction sets 153 may also comprise program code to analyze the signal and compare portions of the signal waveform to a stored characteristic waveform, or other representative pattern, to detect a characteristic feature indicative of the etching endpoint. In one version, the process monitoring instruction sets 352 comprise program code to monitor radiation emissions generated by energized gases in the breakthrough and overetching stages, and to determine the endpoints of these etching stages. In another version, the process monitoring instruction sets 352 comprise program code to monitor polarized radiation reflected from the substrate during the main etching stage to determine the main etching stage endpoint.

While described as separate instruction sets for performing a set of tasks, it should be understood that each of these instruction sets can be integrated with one another, or the tasks of one set of program code integrated with the tasks of another to perform the desired set of tasks. Thus, the controller 300 and the computer program 330 described herein should not be limited to the specific version of the functional routines described herein; and any other set of routines or merged program code that perform equivalent sets of functions are also in the scope of the present invention. Also, while the controller is illustrated with respect to one version of the chamber 106, it may be used for any chamber described herein.

EXAMPLE

The following example illustrates an exemplary method according to the present invention. While the example demonstrates one version, the present invention may be used in other processes and for other uses as would be apparent to those of ordinary skill in the art and the invention should not be limited to the example provided herein.

In this example, a substrate 10 was etched in the DPS chamber 106 described above. The substrate 10 comprised a pattern of features 12, the features 12 comprising a semiconductor mesa 16 formed from polysilicon having an embedded dielectric feature 28 comprising silicon oxide, and having an overlying dielectric 22 covering the semiconductor mesa 16 comprising silicon oxide, as shown in FIG. 1. Table 1 illustrates the process parameters used in each etching stage.

TABLE 1

|  | Gas | Flow Rate (sccm) | Bias Power (Watts) | Source Power (Watts) | Pressure (mTorr) |
| --- | --- | --- | --- | --- | --- |
| Breakthrough Etching Stage | $CF_4/CHF_3$ | 100/50 | 40 | 500 | 4 |
| Main Etching Stage | $CF_4/Cl_2$ | 100/20 | 60 | 600 | 4 |
| First Sidewall Etching Stage | $CF_4/Ar/O_2$ | 60/120/12 | 0 | 1000 | 10 |
| Second Sidewall Etching Stage | $CF_4/Ar$ | 20/150 | 200 | 300 | 4 |
| Overetching Stage | $HBr/Cl_2/He$—$O_2$ | 150/20/20 | 40 | 400 | 4 |

In a breakthrough etching stage, the overlying dielectric 22 was etched to at least partially expose the underlying top surface 18 of the semiconductor mesa 16. The breakthrough etching stage was performed to etch the dielectric by introducing a breakthrough etching gas comprising (i) a halogenated non-hydrogen-containing gas comprising $CF_4$, and (ii) a halogenated hydrogen-containing gas comprising $CHF_3$ into the etching zone 108. The $CF_4$ was introduced at a gas flow rate equivalent to 100 sccm, and the $CHF_3$ was introduced at a gas flow rate equivalent to 50 sccm, for a chamber 106 comprising a process volume of 35,000 cc, to provide a volumetric flow ratio of $CF_4$ to $CHF_3$ of 2:1. The pressure of the etching gas in the chamber 106 was maintained at 4 mTorr. The breakthrough etching gas was energized to etch the dielectric 22 by applying a bias power level to the process electrodes 138, 198 of 40 Watts and a source power level to the antenna 186 of 500 Watts. The overlying dielectric 22 was etched in the breakthrough etching stage until the dielectric 22 had been at least partially removed from the top surface 18 of the semiconductor mesa, as shown in FIG. 2. The endpoint of the breakthrough etching stage was determined by monitoring radiation emissions from the energized breakthrough etching gas in the chamber 106.

Figure 3:
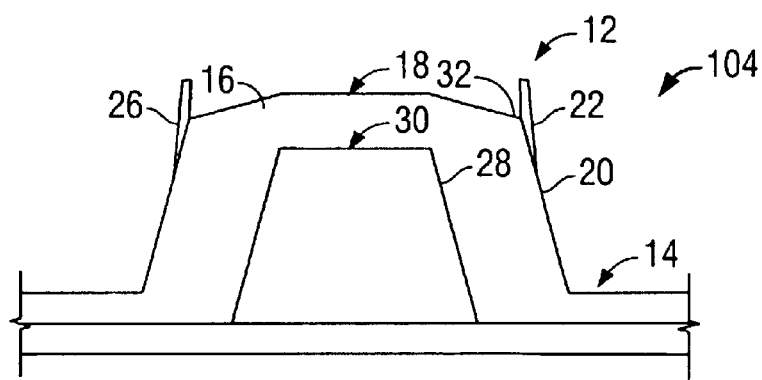
FIG. 3 is a schematic cross-sectional view of the substrate of FIG. 2 after a second etching stage has been performed to etch the top surface of the semiconductor mesa.

In a main etching stage, the remaining dielectric sidewalls 26 and the top surface 18 of the semiconductor mesa 16 were etched to provide a semiconductor mesa 16 having a desired shape. The main etching stage was performed to etch the substrate 10 by introducing a main etching gas comprising (i) a halogenated non-hydrogen-containing gas comprising $CF_4$ and (ii) a chlorine-containing gas comprising $Cl_2$ into the process zone. The $CF_4$ was introduced at a gas flow rate equivalent to 100 sccm, and the $Cl_2$ was introduced at a gas flow rate equivalent to 20 sccm, for a chamber 106 comprising a process volume of 35,000 cc, to provide a volumetric flow ratio of $CF_4$ to $Cl_2$ of 5:1. The pressure of the etching gas in the chamber 106 was maintained at 4 mTorr. The main etching gas was energized to etch the substrate by applying a bias power level to the process electrodes 138, 198 of 60 Watts and a source power level to the antenna 186 of 600 Watts. The remaining dielectric sidewalls 26 and top surface 18 of the semiconductor mesa 16 were etched in the main etching stage until the desired shape of the semiconductor mesa 16 was obtained, as shown in FIG. 3. The remaining dielectric sidewall 26 protected the semiconductor mesa sidewalls to reduce the occurrence of etching of the semiconductor meas sidewalls 16 to preserve the width of the semiconductor mesa 16. Thus, a semiconductor mesa 16 having the desired dimensions was obtained. The endpoint of the main etching stage was determined by monitoring polarized radiation reflected from the surface 14 of the substrate 10.

In a first sidewall etching stage, the remaining dielectric sidewalls 26 were further etched in a plasma comprising a more isotropic nature to trim the remaining dielectric sidewalls. The first sidewall etching stage was performed to trim the dielectric sidewalls 26 by introducing a first sidewall etching gas comprising (i) a reactive gas comprising $CF_4$ and $O_2$, and (ii) a non-reactive gas comprising Ar into the process zone. The $CF_4$ was introduced at a gas flow rate equivalent to 60 sccm, the $O_2$ was introduces at a gas flow rate equivalent to 12 sccm, and the Ar was introduced at a gas flow rate equivalent to 120 sccm, for a chamber 106 comprising a process volume of 35,000 cc, to provide a volumetric flow ratio of Ar to ($CF_4+O_2$) of about 1.7:1. The pressure of the etching gas in the chamber 106 was maintained at 10 mTorr. The first sidewall etching gas was energized to etch the substrate 10 in a more isotropic process by applying a first lower bias RF power level to the process electrodes 138, 198 of substantially 0 Watts, and a first higher source RF power level to the antenna 186 of 1000 Watts. The remaining dielectric sidewalls 26 were etched in the plasma comprising the more isotropic nature, until a desired width and height of the remaining dielectric 26 was obtained, as shown in FIG. 4. The isotropic etching process provides energetic etching of the sides of the dielectric sidewalls 26, as well as the top surface, thereby reducing the width of the remaining sidewalls 26. The substrate 10 was etched in the first sidewall etching stage for about 25 seconds.

In a second sidewall etching stage, the dielectric sidewalls 26 were even further trimmed in a plasma comprising a more anisotropic nature. The second sidewall etching stage was performed to trim the dielectric sidewalls 26 by introducing a second sidewall etching gas comprising (i) a reactive gas comprising $CF_4$ and (ii) a non-reactive gas comprising Ar into the process zone. The $CF_4$ was introduced at a gas flow rate equivalent to 20 sccm, and the Ar was introduced at a gas flow rate equivalent to 150 sccm, for a chamber 106 comprising a process volume of 35,000 cc, to provide a volumetric flow ratio of Ar to $CF_4$ of 7.5:1. The pressure of the etching gas in the chamber 106 was maintained at 4 mTorr. The second sidewall etching gas was energized to etch the substrate 10 in a more anisotropic process by applying a second higher bias power level to the process electrodes 138, 198 of 200 Watts, and a second lower source RF power level to the antenna 186 of 300 Watts. The remaining dielectric sidewalls 26 were etched in the plasma comprising the more anisotropic nature, until a desired amount of the dielectric sidewall 26 had been etched, as shown in FIG. 5. The anisotropic etching process provides energetic etching and sputtering of the top of the sidewalls, to reduce a height of the sidewalls 26. The substrate 10 was etched in the second sidewall etching stage for about 25 seconds.

In a final overetching stage, the top surface 18 of the semiconductor meas was etched to provide a semiconductor mesa 16 having a height substantially equal to the embedded dielectric feature 28 to expose the top surface of the dielectric feature 28 and provide substantially square semiconductor mesa corners 32. The overetching stage was performed to etch the top surface 18 of the semiconductor mesa 16 by introducing an overetching gas comprising (i) a halogen-containing gas comprising HBr and $Cl_2$, and (ii) an oxygen-containing gas comprising He—$O_2$. The HBr was introduced at a gas flow rate equivalent to 150 sccm, the $Cl_2$ was introduced at a gas flow rate equivalent to 20 sccm, and the He—$O_2$ was introduced at a gas flow rate equivalent to 20 sccm for a chamber 106 comprising a process volume of 35,000 cc. The pressure of the etching gas in the chamber 106 was maintained at 4 mTorr. The overetching gas was energized to etch the semiconductor mesa by applying a bias power level to the process electrodes 138, 198 of 40 Watts, and a source RF power level to the antenna 186 of 400 Watts. The overetching gas etched the semiconductor mesa until the desired height of the semiconductor mesa 16 was obtained, as shown in FIG. 6. The remaining dielectric sidewalls 26 inhibited excessive etching of the sidewalls 20 of the semiconductor mesa 16 such that the desired width of the semiconductor mesa 16 was retained and the semiconductor mesa corners 32 were etched to a substantially square shape. The semiconductor mesa 16 was etched in the over etching stage until the endpoint of the etching stage was determined at 20 seconds, by monitoring radiation emissions from the energized overetching gas in the chamber 106.

Although the present invention has been described in considerable detail with regard to certain preferred versions thereof, other versions are possible. For example, the present invention could be used with other etching gases other than those specifically mentioned, and could be used to etch other semiconductor and dielectric materials besides those mentioned. The process chamber 106 may also comprise other equivalent configurations as would be apparent to one of ordinary skill in the art. Thus, the appended claims should not be limited to the description of the preferred versions contained herein.

What is claimed is:

1. A substrate etching method comprising:
   (a) providing a substrate in a process zone, the substrate having a pattern of features comprising dielectric covering semiconductor;
   (b) in a first stage, providing in the process zone, an energized first etching gas having a first selectivity of etching dielectric to semiconductor of at least about 1.8:1, wherein the dielectric is etched preferentially to the semiconductor to etch through the dielectric to at least partially expose the semiconductor; and
   (c) in a second stage, providing in the process zone, an energized second etching gas having a second selec-tivity of etching dielectric to semiconductor of less than about 1:1.8, wherein the semiconductor is etched preferentially to the dielectric.

2. A method according to claim 1 wherein the first etching gas comprises a halogenated non-hydrogen-containing gas and a halogenated hydrogen-containing gas, and wherein the second etching gas comprises the same halogenated non-hydrogen-containing gas and a chlorine-containing gas.

3. A method according to claim 2 wherein the semiconductor comprises a mesa, and the dielectric comprises a top wall and sidewalls covering the semiconductor mesa, and
   wherein in the first stage the energized first etching gas comprises a volumetric flow ratio of the halogenated non-hydrogen-containing gas to the halogenated hydrogen-containing gas selected to etch the top wall of the dielectric to at least partially expose an underlying top surface of the semiconductor mesa; and
   wherein in the second stage, the energized second etching gas comprises the same halogenated non-hydrogen-containing gas and a chlorine-containing gas in a volumetric ratio selected to etch the top surface of the semiconductor mesa and the sidewalls of the dielectric.

4. A method according to claim 3 wherein the semiconductor mesa comprises polysilicon and the dielectric comprises silicon dioxide.

5. A method according to claim 2 wherein the halogenated non-hydrogen-containing gas comprises $CF_4$ and the halogenated hydrogen-containing gas comprises $CHF_3$.

6. A method according to claim 5 wherein the chlorine-containing gas comprises $ClF_2$.

7. A method according to claim 1 wherein in the first stage, radiation emissions from the energized first etching gas are monitored to determine an endpoint of the first etching stage, and in the second stage, the intensity of polarized radiation reflected from the substrate surface is monitored to determine an endpoint of the second stage.

8. A method of etching a substrate in a substrate processing chamber comprising an antenna and process electrodes, the method comprising:
   (a) providing a substrate in the chamber, the substrate having a pattern of features, the features comprising a semiconductor mesa with a dielectric sidewall;
   (b) in a first plasma stage, providing a first etching gas in the chamber and applying a first bias RF power level to the process electrodes and a first source RF power level to the antenna, thereby energizing the first etching gas to etch the semiconductor mesa and the dielectric sidewall; and
   (c) in a second plasma stage, providing an energized second etching gas in the chamber and applying a second bias RF power level to the process electrodes and a second source RF power level to the antenna, thereby energizing the second etching gas to etch the semiconductor mesa and a remaining portion of the dielectric sidewall.

9. A method according to claim 8 wherein the first etching gas comprises a first volumetric flow ratio of non-reactive gas to reactive gas, and the second etching gas comprises a second volumetric flow ratio of the non-reactive gas to the reactive gas, the second volumetric flow ratio being greater than the first volumetric flow ratio.

10. A method according to claim 9 wherein the reactive gas comprises $CF_4$ and non-reactive gas comprises Ar.

11. A method according to claim 9 wherein the first etching gas further comprises $O_2$.

12. A method according to claim 8 wherein the first RF bias power level is less than the second RF bias power level, and the first RF source power level is greater than the second RF source power level.

13. A method according to claim 12 wherein the first RF bias power level is less than about 100 Watts and the second RF bias power level is at least about 150 Watts.

14. A method according to claim 12 wherein the first RF source power level is at least about 500 Watts and the second RF bias power level is less than about 500 Watts.

15. A method according to claim 8 wherein the semiconductor mesa comprises polysilicon and the dielectric sidewall comprises silicon dioxide.

16. A method of etching a substrate in a substrate processing chamber comprising an antenna and process electrodes, the method comprising:
(a) providing a substrate in the chamber, the substrate having a pattern of features, the features comprising a semiconductor mesa covered by a dielectric top wall and dielectric sidewalls,
(b) in a first etching stage, providing in the chamber, an energized first etching gas comprising a halogenated non-hydrogen-containing gas and a halogenated hydrogen-containing gas in a volumetric ratio selected to etch the dielectric top wall to expose the semiconductor mesa; and
(c) in a second etching stage, providing in the chamber, an energized second etching gas comprising the halogenated non-hydrogen-containing gas and a chlorine-containing gas in a volumetric ratio selected to etch the semiconductor mesa and the dielectric sidewalls;
(d) in a third etching stage, providing a third etching gas in the chamber and applying a first bias RF power level to the process electrodes and a first source RF power level to the antenna, thereby energizing the third etching gas to further etch the semiconductor mesa and the dielectric sidewalls; and
(e) in a fourth etching stage, providing an energized fourth etching gas in the chamber and applying a second bias RF power level to the process electrodes and a second source RF power level to the antenna, thereby energizing the second etching gas to etch the semiconductor mesa and a remaining portion of the dielectric sidewalls.

17. A method according to claim 16 wherein the semiconductor mesa comprises polysilicon, and the dielectric top wall and dielectric sidewalls both comprise silicon dioxide, and wherein the energized first etching gas comprises a volumetric flow ratio of halogenated non-hydrogen-containing gas to halogenated hydrogen-containing gas to provide a first selectivity of etching dielectric to semiconductor of at least about 1.8:1.

18. A method according to claim 17 wherein the energized second etching gas comprises a volumetric flow ratio of halogenated non-hydrogen-containing gas to chlorine-containing gas to provide a second selectivity of etching dielectric to semiconductor of less than about 1:1.8, wherein the semiconductor is etched preferentially to the dielectric.

19. A method according to claim 16 wherein the first RF bias power level is less than about 100 Watts and the second RF bias power level is at least about 150 Watts, and wherein the first RF source power level is at least about 500 Watts and the second RF bias power level is less than about 400 Watts.

20. A method according to claim 19 further comprising a fifth etching stage comprising providing in the chamber, an energized fifth etching gas to further etch the semiconductor mesa to a predetermined height.

21. A method according to claim 20 wherein the fifth etching gas comprises at least one of HBr, $Cl_2$ and $HeO_2$.

22. A method of etching a substrate in a chamber comprising an antenna and process electrodes, the method comprising:
(a) providing the substrate in the chamber;
(b) in a first stage, providing in the chamber, an energized first etching gas comprising $CF_4$ and $CHF_3$;
(c) in a second stage, providing in the chamber, an energized second etching gas comprising $CF_4$ and $Cl_2$;
(d) in a third stage, providing in the chamber, a third etching gas comprising Ar, $CF_4$ and $O_2$, and applying a first bias RF power level to the process electrodes and a first source RF power level to the antenna;
(e) in a fourth stage, providing in the chamber, an energized fourth etching gas comprising Ar and $CF_4$, and applying a second bias RF power level to the process electrodes and a second source RF power level to the antenna; and
(f) in a fifth stage, providing in the chamber, an energized fifth etching gas comprising HBr, $Cl_2$ and $HeO_2$.

23. A method according to claim 22 wherein (b) comprises providing a volumetric flow ratio of $CF_4$ to $CHF_3$ of from about 4:1 to about 1:4.

24. A method according to claim 22 wherein (c) comprises providing a volumetric flow ratio of $CF_4$ to $Cl_2$ of from about 5:1 to about 2:1.

25. A method according to claim 22 wherein (d) comprises providing a volumetric flow ratio of Ar to $CF_4$ and $O_2$ of from about 1:1 to about 2:1.

26. A method according to claim 22 wherein (e) comprises providing a volumetric flow ratio of Ar to $CF_4$ of from about 8:1 to about 20:1.

27. A method according to claim 22 wherein (d) comprises applying a first bias RF power level of from about 0 Watts to about 50 Watts to the process electrodes and a first source RF power level of from about 800 to about 1500 Watts to the antenna.

28. A method according to claim 22 wherein (e) comprises applying a second bias RF power level of from about 150 Watts to about 300 Watts to the electrodes and a second source RF power level of from about 200 Watts to about 400 Watts to the antenna.

29. A method of etching a pattern of features on a substrate in a chamber comprising an antenna and process electrodes, the method comprising:
(a) providing a substrate in the chamber;
(b) in a first stage, providing in the chamber, an energized first etching gas comprising $CF_4$ and $CHF_3$ in a volumetric flow ratio of from about 4:1 to about 1:4;
(c) in a second stage, providing in the chamber, an energized second etching gas comprising $CF_4$ and $Cl_2$ in a volumetric flow ratio of from about 5:1 to about 2:1;
(d) in a third stage, providing in the chamber, a third etching gas comprising Ar, $CF_4$ and $O_2$ in a volumetric flow ratio of Ar to ($CF_4$ and $O_2$) of from about 1:1 to about 2:1, applying a first bias RF power level of from about 0 Watts to about 50 Watts to the process electrodes, and applying a first source RF power level of from about 800 to about 1500 Watts to the antenna to energize the third etching gas;

(e) in a fourth stage, providing in the chamber, an energized fourth etching gas comprising Ar and $CF_4$ in a volumetric flow ratio of from about 8:1 to about 20:1, applying a second bias RF power level to the process electrodes of from about 150 Watts to about 300 Watts, and applying a second source RF power level to the antenna of from about 200 Watts to about 400 Watts to energize the second etching gas; and (f) in a fifth stage, providing in the chamber, an energized fifth etching gas comprising HBr, $Cl_2$ and $HeO_2$.

* * * * *